(12) United States Patent
Park

(10) Patent No.: US 7,443,733 B2
(45) Date of Patent: Oct. 28, 2008

(54) WORD LINE VOLTAGE GENERATOR AND FLASH MEMORY DEVICE INCLUDING THE SAME, AND METHOD OF GENERATING WORD LINE VOLTAGE THEREOF

(75) Inventor: Seong Je Park, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 119 days.

(21) Appl. No.: 11/489,685

(22) Filed: Jul. 20, 2006

(65) Prior Publication Data

US 2007/0183207 A1   Aug. 9, 2007

(30) Foreign Application Priority Data

Feb. 6, 2006   (KR) .................. 10-2006-0011086

(51) Int. Cl.
*G11C 11/34* (2006.01)
(52) U.S. Cl. ...................... 365/185.23; 365/185.22
(58) Field of Classification Search ............ 365/185.23, 365/185.22, 230.06
See application file for complete search history.

(56) References Cited

U.S. PATENT DOCUMENTS 6,473,344 B2 * 10/2002 Kim et al. .............. 365/189.09
6,870,766 B2    3/2005 Cho et al.
7,269,092 B1 *  9/2007 Miwa .................... 365/230.06
2007/0263453 A1 * 11/2007 Tanzawa ................ 365/185.23

FOREIGN PATENT DOCUMENTS

KR        100176116      11/1998
KR        100283029      12/2000
KR       1020030014359    2/2003

OTHER PUBLICATIONS

Notice of Allowance for Korean App. 10-2006-001086.

* cited by examiner

*Primary Examiner*—Anh Phung
(74) *Attorney, Agent, or Firm*—Lowe Hauptman Ham & Berner LLP

(57) ABSTRACT

A word line voltage generator that generates a word line voltage, which is selectively changed depending on a temperature, a flash memory device including the word line voltage generator, and a method of generating the word line voltage. The word line voltage generator includes a read voltage generator and a controller. The read voltage generator generates a read voltage or a verify voltage based on one of reference voltages in response to an enable control signal and supplies the read voltage or the verify voltage to one of a plurality of global word lines in response to a row decoding signal, during a read operation or a read operation for program verification, of the flash memory device. The controller generates one of the reference voltages in response to a read control signal or a verify control signal. When a temperature is varied, the read voltage generator changes the level of the read voltage or the verify voltage in reverse proportion to the temperature.

32 Claims, 9 Drawing Sheets

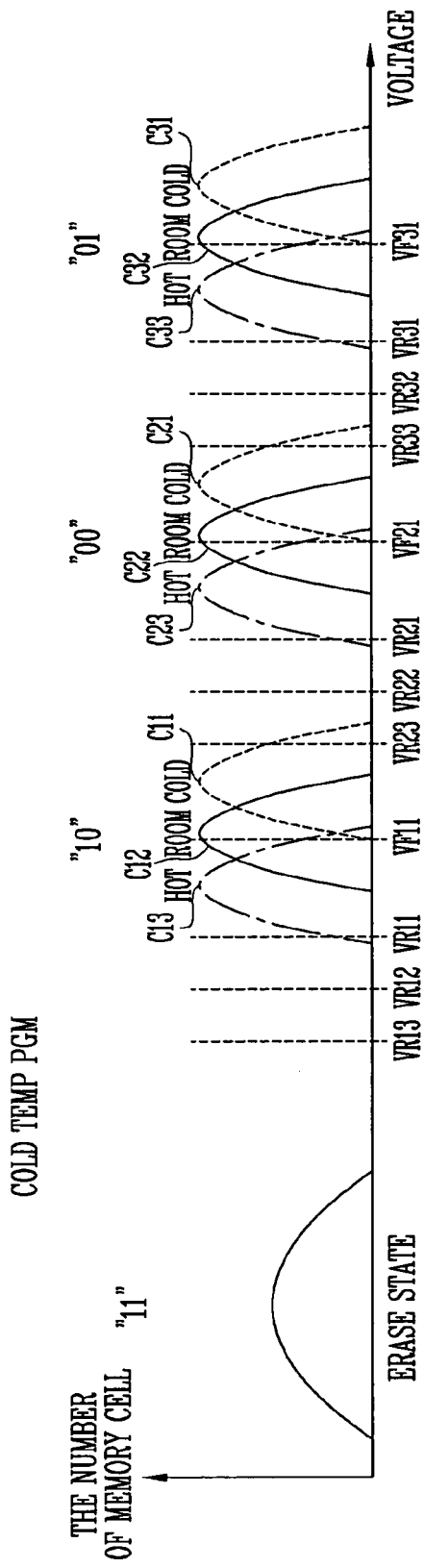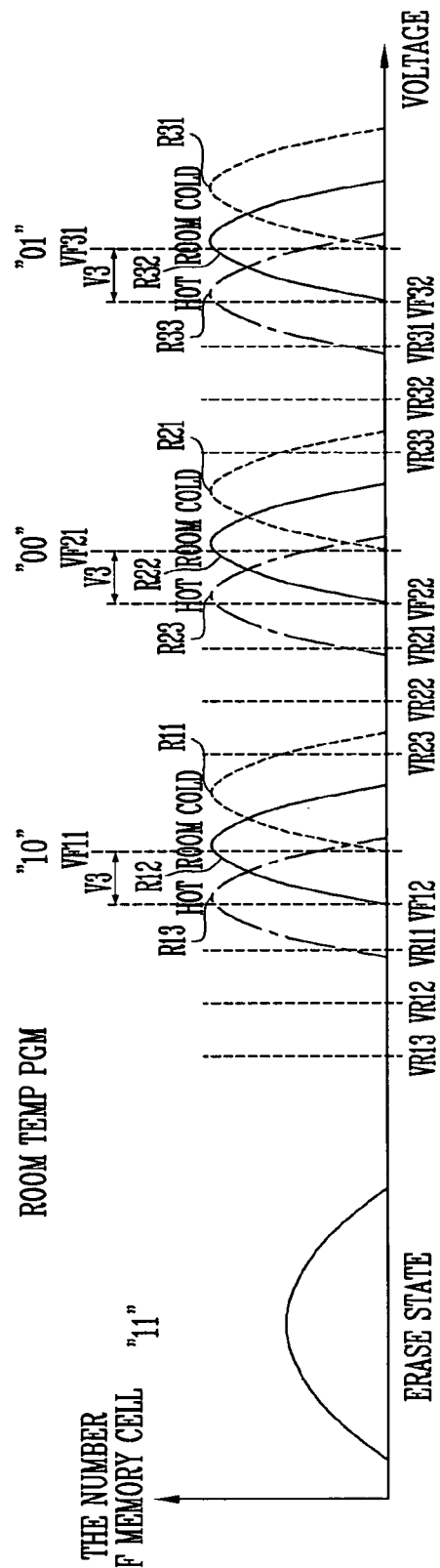

WORD LINE VOLTAGE GENERATOR AND FLASH MEMORY DEVICE INCLUDING THE SAME, AND METHOD OF GENERATING WORD LINE VOLTAGE THEREOF

BACKGROUND

1. Field of the Invention

The present invention generally relates to semiconductor memory devices, and more particularly, to flash memory devices.

2. Discussion of Related Art

In general, a memory cell of a flash memory device can be classified into a Single-Level Cell (hereinafter, referred to as "SLC") and a Multi-Level Cell (hereinafter, referred to as "MLC") depending on the number of data bits stored. 1-bit data having a logical value "1" or "0" can be stored in the SLM. 2-bit data having a logical value of any one of "11", "10", "01", and "00" can be stored in the MLC. Accordingly, after the program operation, the threshold voltage of the memory cell (SLC or MLC) included in the flash memory device is changed to a voltage corresponding to a stored data value.

For example, in the case where the flash memory device includes the SLC, the threshold voltage of the SLC is changed to a voltage corresponding to "1" or "0" after the program operation of the flash memory device. Meanwhile, in the case where the flash memory device includes the MLC, the threshold voltage is changed to a voltage corresponding to any one of "11", "10", "01", and "00" after the program operation of the flash memory device.

The threshold voltage distributions of the memory cells according to the program procedure of the flash memory device in the related art will be described in more detail below with reference to FIG. 1.

FIGS. 1A to 1C are graphs illustrating the threshold voltage distributions of memory cells according to the program procedure of the flash memory device in the related art. FIG. 1 is related to the program operation of the flash memory device including the SLC. The graphs of FIGS. 1A to 1C do not illustrate actual threshold voltage distributions of the SLC, but illustrate threshold voltage distributions of the SLC, which are seen from the viewpoint of the voltage generator.

FIG. 1A is a graph illustrating the threshold voltage distributions of the SLC when the program operation of the flash memory device is performed at a cold temperature. FIG. 1b is a graph illustrating the threshold voltage distributions of the SLC when the program operation of the flash memory device is performed at a room temperature. FIG. 1c is a graph illustrating the threshold voltage distributions of the SLC when the program operation of the flash memory device is performed at a hot temperature.

As can be seen from FIGS. 1A to 1C, the threshold voltage of the SLC programmed at the cold temperature is relatively lower than that of the SLC programmed at the hot temperature. In other words, it can be seen that the locations of graphs PS31 to PS33 shown in FIG. 1C are slightly moved in a direction in which the voltage is increased (to the right side in FIG. 1C) compared with the locations of graphs PS11 to PS13 shown in FIG. 1A.

The reason why the threshold voltage distributions of the SLC look changed according to the temperature during the program operation as described above is that the operating conditions of internal circuits are varied depending on variation in temperature. The operating conditions of the internal circuits may include, for example, an amount of current of memory cells, the impedance of a word line when viewing the word line from the voltage generator, and threshold voltages and saturation currents of transistors included in a page buffer.

The operating conditions of the internal circuits decrease the voltage transferred to the gate of the SLC through the word line at the cold temperature. Furthermore, the operating conditions of the internal circuits increase the voltage transferred to the gate of the SLC at the hot temperature. Due to this, although the voltage generator applies a constant verify voltage to the word line, a verify voltage PV transferred to the gate of the SLC may be increased or decreased depending on the operating conditions of the internal circuits.

For example, if the verify voltage PV transferred to the gate of the SLC is decreased by the operating conditions of the internal circuits, the program operation is finished with the SLC not being sufficiently programmed. As a result, the whole threshold voltage of the programmed SLC is decreased (i.e., moved toward the left side in FIG. 1A), as in the graphs PS11 to PS13 of FIG. 1A. On the other hand, if the verify voltage PV transferred to the gate of the SLC is increased by the operating conditions of the internal circuits, the program operation is finished with the SLC being excessively programmed. As a result, the whole threshold voltage of the programmed SLC is increased (i.e., moved toward the right side in FIG. 1C), as in the graphs PS31 to PS33 of FIG. 1C.

Consequently, variation in the operating conditions of the internal circuits depending on the temperature during the program operation changes the verify voltage transferred to the gate of the SLC, and variation in the verify voltage changes the threshold voltage distributions of the SLC. As a result, the width of the threshold voltage distributions of the programmed SLC after the program operation must be narrowed as indicated by "W1", but is widened as indicated by "W2" considering variation in temperature upon program.

If the width of the threshold voltage distributions of the SLC is widened as described above, the program operating speed of the flash memory device is decreased and a program disturbance phenomenon is generated.

In a similar way, the operating conditions of the internal circuits are changed depending on variation in temperature during the normal read operation. This will be described in more detail below.

When the normal read operation of the flash memory device is performed at the cold temperature, the operating conditions of the internal circuits are changed to decrease a read voltage RV that is actually transferred to the gate of the SLC. In other words, although the voltage generator applies a constant read voltage RV to the word line regardless of the temperature, the read voltage RV transferred to the gate of the SLC is decreased more at the cold temperature than at room temperature due to the operating conditions of the internal circuits. As a result, from the viewpoint of the voltage generator, the whole threshold voltage of the SLC during the normal read operation at the cold temperature may look relatively high compared with the whole threshold voltage of the SLC during the normal read operation at room temperature.

In a similar way, when the normal read operation of the flash memory device is performed at the hot temperature, the operating conditions of the internal circuits are changed to increase the read voltage RV that is actually transferred to the gate of the SLC. In other words, although the voltage generator supplies a constant read voltage RV to the word line regardless of the temperature, the read voltage RV transferred to the gate of the SLC is increased more at the hot temperature than at room temperature due to the operating conditions of the internal circuits that are changed depending on a temperature. As a result, from the viewpoint of the voltage generator, the whole threshold voltage of the SLC during the normal read operation at the hot temperature may look relatively low compared with the whole threshold voltage of the SLC during the normal read operation at room temperature.

Therefore, the threshold voltage distributions of the SLC during the normal read operation can be represented by the graphs PS11 to PS13, PS21 to PS23, and PS31 to PS33 as shown in FIGS. 1a to 1c.

In more detail, the graphs PS11 to PS13 indicate the threshold voltage distributions of the SLC, respectively, which are taken into consideration from the viewpoint of the voltage generator when the data of the SLC programmed at the cold temperature are read at the cold temperature, room temperature, and the hot temperature, respectively, (i.e., during the normal read operation). Furthermore, the graphs PS21 to PS23 indicate the threshold voltage distributions of the SLC, respectively, which are considered from the viewpoint of the voltage generator when the data of the SLC programmed at room temperature are read at the cold temperature, room temperature, and the hot temperature, respectively. Furthermore, the graphs PS31 to PS33 indicate the threshold voltage distributions of the SLC, respectively, which are taken into consideration from the viewpoint of the voltage generator when the data of the SLC programmed at the hot temperature are read at the cold temperature, room temperature, and the hot temperature, respectively.

In the case where the threshold voltage distributions of the SLC are changed depending on a temperature during the normal read operation as described above, it is preferred that the width of the threshold voltage distributions of the SLC be narrow as indicated by "W1". However, the width of the threshold voltage distributions of the SLC is widened as indicated by "W2".

As described above, the threshold voltage distributions of the SLC are changed depending on variation in a temperature during the program operation and the normal read operation. However, the related art voltage generator applies a constant verify voltage PV or a constant read voltage RV to the word line regardless of a temperature. Due to this, the width of the threshold voltage distributions of a programmed SLC is further widened and failure may occur in the read operation.

In more detail, in the event that the data of a SLC programmed at the cold temperature are read at the hot temperature (corresponding to the graph PS13), a data value "1" corresponding to an erased SLC is read as indicated by "A" in spite of the programmed SLC, leading to failure in the read operation. As a result, if a constant read voltage RV is applied to the word line regardless of a temperature, the sensing margin of read data during the normal read operation is decreased. For example, the sensing margin of read data of a SLC having threshold voltage distributions as indicated by the graph PS13 of the graphs PS11 to PS13 is the lowest.

On the other hand, in the case where the flash memory device includes the MLC, the threshold voltage distributions of the MLC are widened and the sensing margin of read data is decreased, depending on variation in temperature during the program operation (more particularly, during the program verification operation) or during the read operation in a similar way as the above.

SUMMARY OF THE INVENTION

An embodiment of the present invention is that it provides a word line voltage generator, in which it can reduce the width of threshold voltage distributions of a memory cell and guarantee the sensing margin of read data by selectively changing a verify voltage or a read voltage in reverse proportion to a temperature during the read operation or the normal read operation for program verification.

Another embodiment of the present invention is that it provides a flash memory device, in which it can reduce the width of threshold voltage distributions of a memory cell and guarantee the sensing margin of read data by selectively changing a verify voltage or a read voltage in reverse proportion to a temperature during the read operation or the normal read operation for program verification.

Further another embodiment of the present invention is that it provides a method of generating a word line voltage, in which it can reduce the width of threshold voltage distributions of a memory cell and guarantee the sensing margin of read data by selectively changing a verify voltage or a read voltage in reverse proportion to a temperature during the read operation or the normal read operation for program verification.

According to an aspect of the present invention, there is provided a word line voltage generator of a flash memory device having a plurality of memory cells. The word line voltage generator includes a read voltage generator and a controller. The read voltage generator generates a read voltage or a verify voltage based on one of reference voltages in response to an enable control signal and supplies the read voltage or the verify voltage to one of a plurality of global word lines in response to a row decoding signal, during a read operation or a read operation for program verification, of the flash memory device. The controller generates one of the reference voltages in response to a read control signal or a verify control signal. When a temperature is varied, the read voltage generator changes the level of the read voltage or the verify voltage in reverse proportion to the temperature.

According to another aspect of the present invention, there is provided a flash memory device, including a memory cell array, a X-decoder, a high voltage generator, a block selection unit, and a word line voltage generator. The memory cell array includes a plurality of memory cell blocks and each of the plurality of memory cell blocks includes a plurality of memory cells. The X-decoder decodes a row address signal and generates a row decoding signal. The high voltage generator generates a drain bias voltage, a source bias voltage, and a word line voltage and supplies the drain bias voltage and the source bias voltage to a global drain selection line and a global source selection line, respectively, in response to a read command, a program command, and an erase command, and supplies the word line voltage to a part or all of a plurality of global word lines in response to the row decoding signal. The block selection unit selects one of the plurality of memory cell blocks in response to the row decoding signal, and connects a local drain selection line, a local source selection line, and a plurality of local word lines of a selected memory cell block to the global drain selection line, the global source selection line, and the plurality of global word lines, respectively. The word line voltage generator generates a read voltage or a verify voltage, which is changed in reverse proportion to a temperature, in response to an enable control signal and a read control signal or a verify control signal, and supplies the read voltage or the verify voltage to one of the plurality of global word lines in response to the row decoding signal, during a read operation or a read operation for program verification, of the flash memory device.

According to further another aspect of the present invention, there is provided a method of generating a word line voltage during a read operation or a read operation for program verification, of a flash memory device including a plurality of memory cells, the method including the steps of generating one of reference voltages in response to, a read control signal or a verify control signal; generating a read voltage or a verify voltage, which is changed in reverse proportion to a temperature and is based on one of the reference voltages, as the word line voltage in response to an enable control signal; and supplying the read voltage or the verify voltage to one of a plurality of global word lines in response to a row decoding signal.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 8A to 8C are graphs illustrating the threshold voltage distributions of multi-level cells according to the program procedure when the flash memory device shown in FIG. 5 includes the multi-level cells according to an embodiment of the present invention.

DETAILED DESCRIPTION OF EMBODIMENTS

The present invention will now be described in detail in connection with certain exemplary embodiments with reference to the accompanying drawings.

Figure 2:
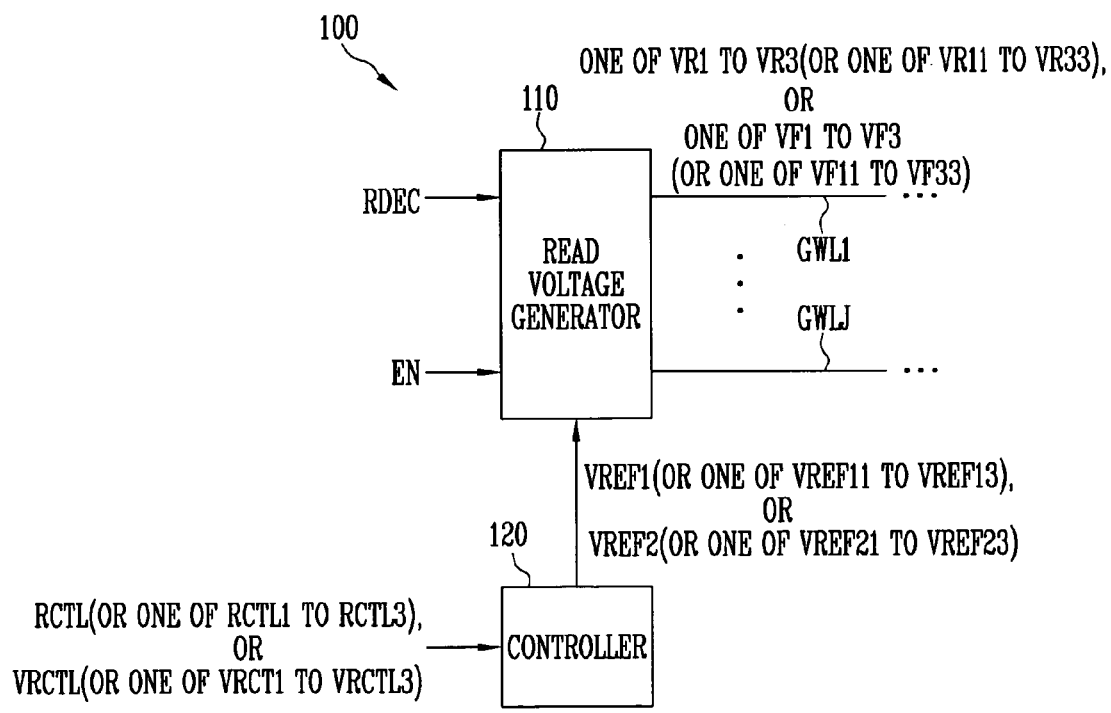
FIG. 2 is a block diagram of a word line voltage generator according to an embodiment of the present invention.

FIG. 2 is a block diagram of a word line voltage generator according to an embodiment of the present invention.

Referring to FIG. 2, the word line voltage generator 100 includes a read voltage generator 110 and a controller 120.

The read voltage generator 110 generates a read voltage (one of VR1 to VR3 (or one of VR11 to VR33)) or a verify voltage (one of VF1 to VF3 (or one of VF11 to VF33)) based on one of a reference voltage (VREF1 (or one of VREF11 to VREF13)) or VREF2 (or one of VREF21 to VREF23)) in response to an enable control signal EN.

When a temperature is varied, the read voltage generator 110 changes the level of the read voltage (one of VR1 to VR3 (or one of VR11 to VR33)) or the verify voltage (one of VF1 to VF3 (or one of VF11 to VF33)) in reverse proportion to the temperature.

Furthermore, the read voltage generator 110 supplies the read voltage (one of VR1 to VR3 (or one of VR11 to VR33)) or the verify voltage (one of VF1 to VF3 (or one of VF11 to VF33)) to one (for example, GWL1) of a plurality of global word lines GWL1 to GWLJ (J is an integer) in response to a row decoding signal RDEC.

The controller 120 generates one (VREF1 (or one of VREF11 to VREF13)) or VREF2 (or one of VREF21 to VREF23)) of the reference voltages in response to a read control signal RCTL (or one of read signals RCTL1 to RCTL3) or a verify control signal VRCTL (or one of verify signals VRCTL1 to VRCTL3). The operation of the controller 120 will be described in more detail below.

An example in which a memory cell array 201 of a flash memory device 200 (refer to FIG. 5) including the word line voltage generator 100 is a SLC and an example in which the memory cell array 201 of the flash memory device 200 including the word line voltage generator 100 is a MLC may exist.

In the case where the memory cell array 201 includes the SLC, the read control signal RCTL is inputted to the controller 120 during the read operation of the flash memory device 200. The controller 120 generates the reference voltage VREF1 in response to the read control signal RCTL. Furthermore, during the read operation for program verification of the flash memory device 200, the verify control signal VRCTL is inputted to the controller 120. The controller 120 generates the reference voltage VREF2 in response to the verify control signal VRCTL.

Meanwhile, in the case where the memory cell array 201 includes the MLC, during the read operation of the flash memory device 200, one of the read signals RCTL1 to RCTL3 is inputted to the controller 120 as the read control signal RCTL. The controller 120 generates one of the reference voltages VREF11 to VREF13 in response to one of the read signals RCTL1 to RCTL3. Furthermore, during the read operation for program verification of the flash memory device 200, one of the verify signals VRCTL1 to VRCTL3 is inputted to the controller 120 as the verify control signal VRCTL.

The controller 120 generates one of the reference voltages VREF21 to VREF23 in response to one of the verify signals VRCTL1 to VRCTL3.

The construction and operation of the read voltage generator 110 will be described in detail below with reference to FIG. 3.

Figure 3:
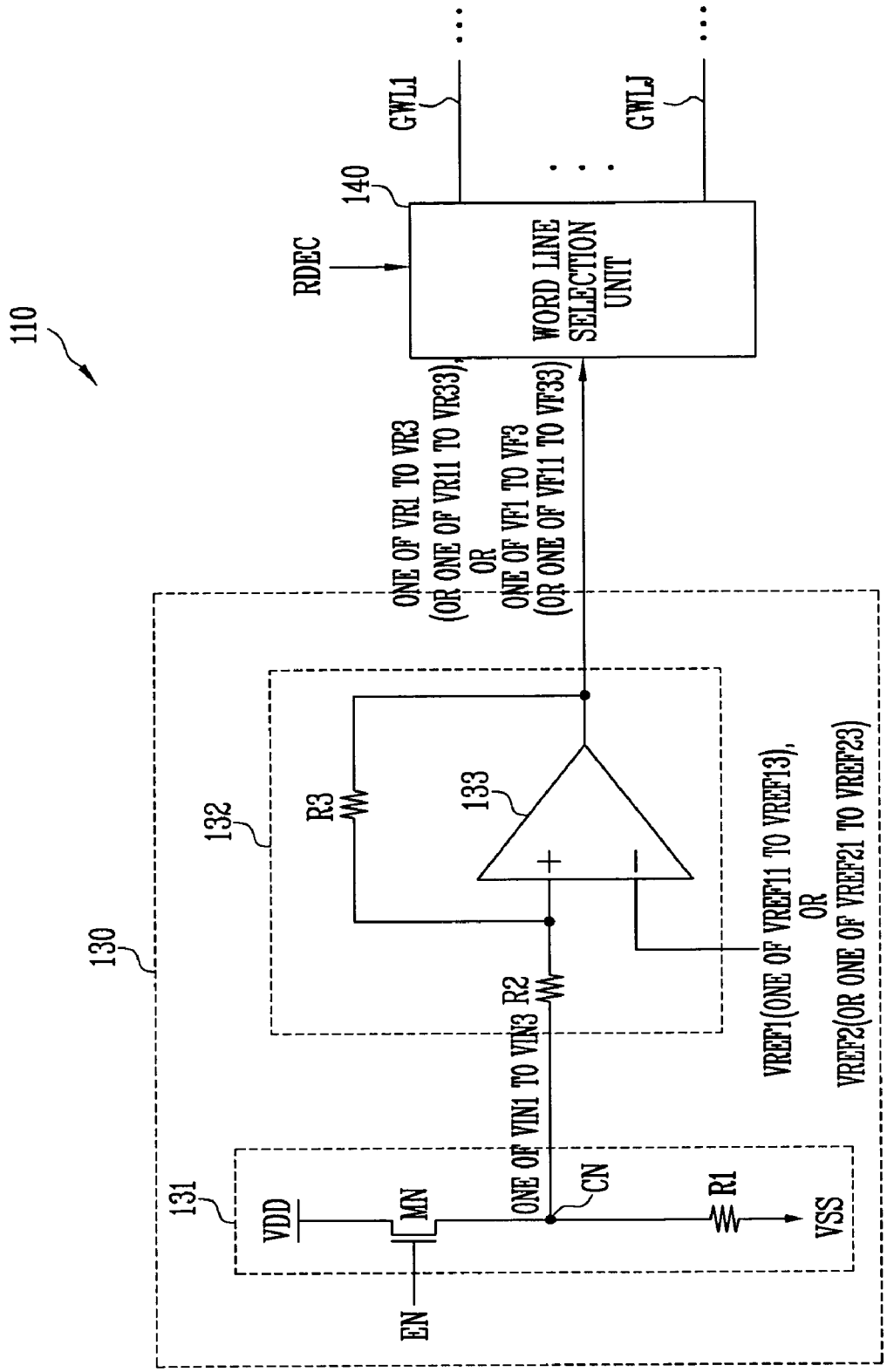
FIG. 3 is a detailed circuit diagram of a read voltage generator shown in FIG. 2 according to an embodiment of the present invention.

FIG. 3 is a detailed circuit diagram of the read voltage generator 110 shown in FIG. 2. The read voltage generator 110 includes a voltage generating circuit 130 and a word line selection unit 140.

The voltage generating circuit 130 includes a voltage divider 131 and an operational amplifier circuit 132.

The voltage divider 131 includes a switching circuit MN and a resistor R1. The switching circuit MN is connected between an internal voltage VDD and a control node CN is turned on or off in response to an enable control signal EN. The resistor R1 is connected between the control node CN and a ground voltage VSS.

When the switching circuit MN is turned on, the internal voltage VDD is divided by the resistance ratio of the switching circuit MN and the resistor R1 and one of divided voltages VIN1 to VIN3 is generated from the control node CN. Preferably, the resistance value of the switching circuit MN may be changed depending on variation in temperature. When the resistance value of the switching circuit MN is changed, the resistance ratio of the switching circuit MN and the resistor R1 is changed and the level of one of the divided voltages VIN1 to VIN3 is changed accordingly.

For example, the switching circuit MN may be implemented using a NMOS transistor. Hereinafter, it is assumed that the switching circuit MN is the NMOS transistor. In this case, the resistance value of the NMOS transistor MN is varied in reverse proportion to a temperature. Furthermore, the NMOS transistor MN is turned on when the enable control signal EN is enabled.

Figure 4:
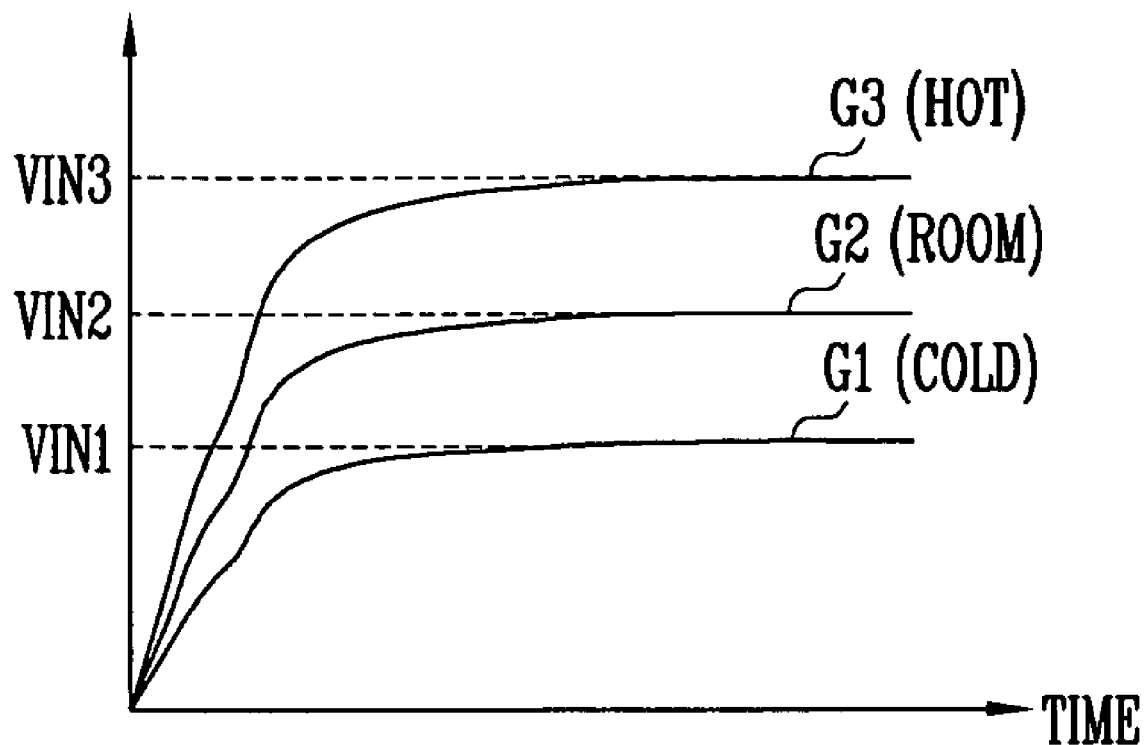
FIG. 4 is a graph illustrating the relationship between the temperature and divided voltages generated by a voltage divider shown in FIG. 3 according to an embodiment of the present invention.

FIG. 4 is a graph illustrating the relationship between the temperature and the divided voltages VIN1 to VIN3 generated by the voltage divider 131. As can be seen from graphs G1 to G3 of FIG. 4, the resistance value of the NMOS transistor MN deceases from a cold temperature to a hot temperature. As a result, the voltage divider 131 increases the divided voltage from VIN1 to VIN3.

The operational amplifier circuit 132 includes resistors R2, R3 and an operational amplifier 133. The resistor R2 is connected between the control node CN and a non-invert input terminal + of the operational amplifier 133. The resistor R3 is connected between the non-invert input terminal + and an output terminal of the operational amplifier 133 and forms a feedback loop of the operational amplifier 133.

The operational amplifier 133 has a gain decided according to a resistance ratio of the resistors R2, R3, and outputs the read voltage (one of VR1 to VR3 (or one of VR11 to VR33)) or the verify voltage (one of VF1 to VF3 (or one of VF11 to VF33)) based on one of the divided voltages VIN1 to VIN3 and the reference voltage (VREF1 (or one of VREF11 to VREF13)) or VREF2 (or one of VREF21 to VREF23)).

The divided voltages VIN1 to VIN3, the read voltages VR1 to VR3, VR11 to VR33, and the verify voltages VF1 to VF3, VF11 to VF33 can be expressed in the following equations.

$$VIN1\sim VIN3 = VDD - V_{th} \quad \text{[Equation 1]}$$

(where, $V_{th}$ is the threshold voltage of NMOS transistor depending on temperature)

$$VR1 = VREF1 + \left(\frac{R3}{R2}\right)(VREF1 - VIN1), \quad \text{[Equation 2]}$$
$$VR2 = VREF1 + \left(\frac{R3}{R2}\right)(VREF1 - VIN2),$$
$$VR3 = VREF1 + \left(\frac{R3}{R2}\right)(VREF1 - VIN3)$$

$$VR11 = VREF11 + \left(\frac{R3}{R2}\right)(VREF11 - VIN1), \quad \text{[Equation 3]}$$
$$VR12 = VREF11 + \left(\frac{R3}{R2}\right)(VREF11 - VIN2),$$
$$VR13 = VREF11 + \left(\frac{R3}{R2}\right)(VREF11 - VIN3)$$

$$VR21 = VREF12 + \left(\frac{R3}{R2}\right)(VREF12 - VIN1), \quad \text{[Equation 4]}$$
$$VR22 = VREF12 + \left(\frac{R3}{R2}\right)(VREF12 - VIN2),$$
$$VR23 = VREF12 + \left(\frac{R3}{R2}\right)(VREF12 - VIN3)$$

$$VR31 = VREF13 + \left(\frac{R3}{R2}\right)(VREF13 - VIN1), \quad \text{[Equation 5]}$$
$$VR32 = VREF13 + \left(\frac{R3}{R2}\right)(VREF13 - VIN2),$$
$$VR33 = VREF13 + \left(\frac{R3}{R2}\right)(VREF13 - VIN3)$$

-continued $$VF1 = VREF2 + \left(\frac{R3}{R2}\right)(VREF2 - VIN1), \quad \text{[Equation 6]}$$
$$VF2 = VREF2 + \left(\frac{R3}{R2}\right)(VREF2 - VIN2),$$
$$VF3 = VREF2 + \left(\frac{R3}{R2}\right)(VREF2 - VIN3)$$

$$VF11 = VREF21 + \left(\frac{R3}{R2}\right)(VREF21 - VIN1), \quad \text{[Equation 7]}$$
$$VF12 = VREF21 + \left(\frac{R3}{R2}\right)(VREF21 - VIN2),$$
$$VF13 = VREF21 + \left(\frac{R3}{R2}\right)(VREF21 - VIN3)$$

$$VF21 = VREF22 + \left(\frac{R3}{R2}\right)(VREF22 - VIN1), \quad \text{[Equation 8]}$$
$$VF22 = VREF22 + \left(\frac{R3}{R2}\right)(VREF22 - VIN2),$$
$$VF23 = VREF22 + \left(\frac{R3}{R2}\right)(VREF22 - VIN3)$$

$$VF31 = VREF23 + \left(\frac{R3}{R2}\right)(VREF23 - VIN1), \quad \text{[Equation 9]}$$
$$VF32 = VREF23 + \left(\frac{R3}{R2}\right)(VREF23 - VIN2),$$
$$VF33 = VREF23 + \left(\frac{R3}{R2}\right)(VREF23 - VIN3)$$

The word line selection unit 140 selects one of the plurality of global word lines GWL1 to GWLJ in response to a row decoding signal RDEC, and supplies the read voltage (one of VR1 to VR3 (or one of VR11 to VR33)) or the verify voltage (one of VF1 to VF3 (or one of VF11 to VF33)), which are received from the operational amplifier circuit 130, to a selected global word line.

Figure 5:
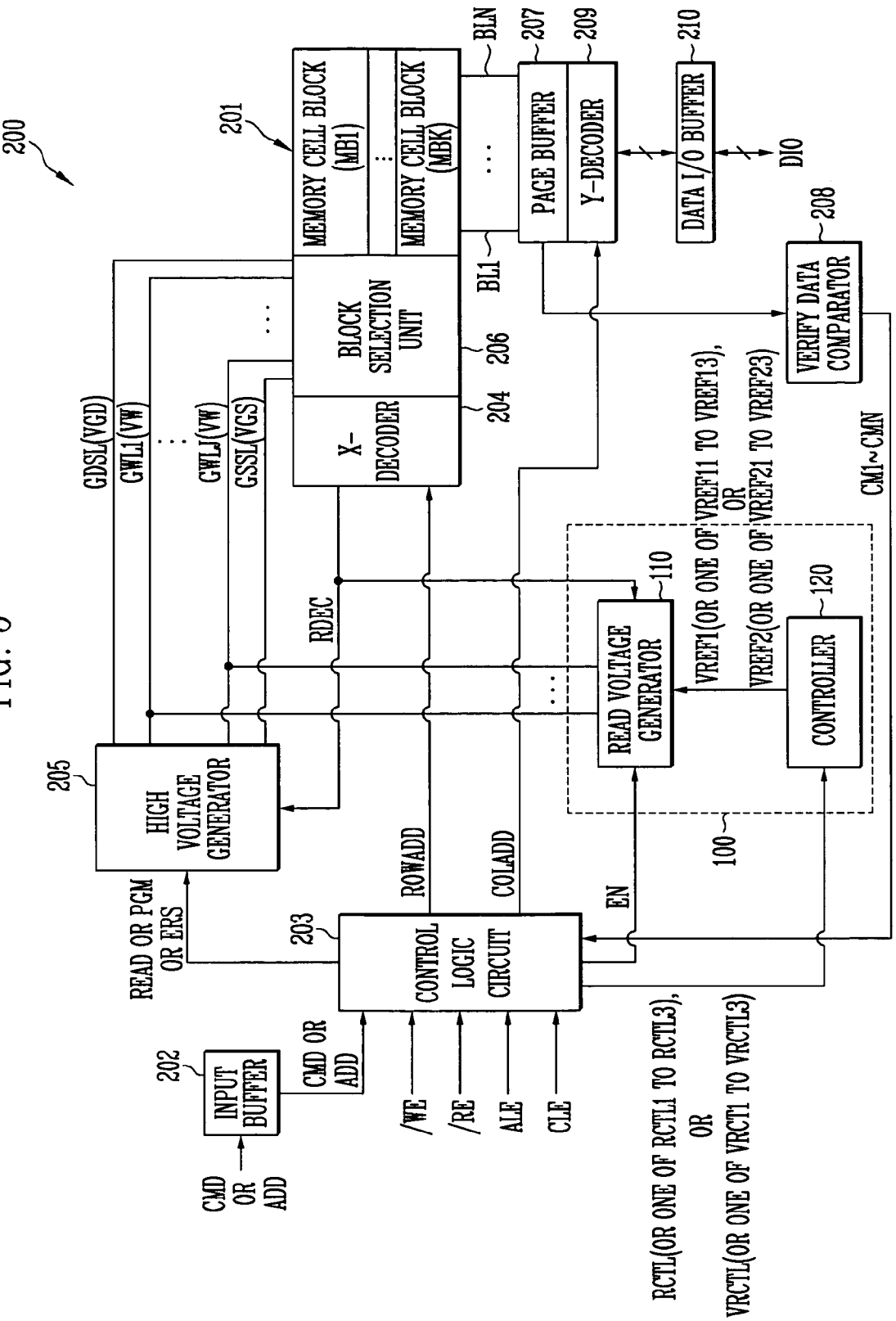
FIG. 5 is a block diagram of a flash memory device according to an embodiment of the present invention.

FIG. 5 is a block diagram of a flash memory device according to an embodiment of the present invention.

Referring to FIG. 5, the flash memory device 200 includes the word line voltage generator 100, a memory cell array 201, an input buffer 202, a control logic circuit 203, a X-decoder 204, a high voltage generator 205, a block selection unit 206, a page buffer 207, a verify data comparator 208, a Y-decoder 209, and a data I/O buffer 210. The construction and operation of the word line voltage generator 100 are the same as those described above and description thereof will be omitted for simplicity.

The memory cell array 201 includes memory cell blocks MB1 to MBK (K is an integer) respectively having a plurality of memory cells (not shown).

The input buffer 202 receives a command signal CMD or an external address signal ADD and outputs it to the control logic circuit 203.

The control logic circuit 203 receives the command signal CMD or the external address signal ADD in response to external control signals /WE, /RE, ALE, and CLE. The control logic circuit 203 generates one of a read command READ, a program command PGM, and an erase command ERS in response to the command signal CMD. Furthermore, the control logic circuit 203 generates the enable control signal EN, and the read control signal RCTL (or one of the read signals RCTL1 to RCTL3) or the verify control signal VRCTL (or one of the verify signals VRCTL1 to VRCTL3) in response to the command signal CMD or the external address signal ADD. Furthermore, the control logic circuit 203 generates a row address signal ROWADD and a column address signal COLADD based on the external address signal ADD.

The X-decoder 204 decodes the row address signal ROW-ADD and outputs the row decoding signal RDEC.

The high voltage generator 205 generates a drain bias voltage VGD, a source bias voltage VGS, and a word line voltage (or a word line bias voltage) VW in response to any one of the read command READ, the program command PGM, and the erase command ERS. Preferably, the high voltage generator 205 may generate a program voltage (for example, 18V) and a program pass voltage (for example, 10V) as the word line voltage VW or a verify read pass voltage (for example, 4.5V) in response to the program command PGM.

Furthermore, the high voltage generator 205 generates the read pass voltage (4.5V) as the word line voltage VW in response to the read command READ. The high voltage generator 205 generates an erase voltage as the word line voltage VW in response to the erase command ERS. The high voltage generator 205 also supplies the drain bias voltage VGD and the source bias voltage VGS to a global drain selection line GDSL and a global source selection line GSSL, respectively. Furthermore, the high voltage generator 205 supplies the word line voltage VW to a part or all of the global word lines GWL1 to GWLJ (J is an integer) in response to the row decoding signal RDEC.

In more detail, during the program operation of the flash memory device 200, the high voltage generator 205 supplies the program voltage to any one of the global word lines GWL1 to GWLJ and supplies the program pass voltage to the remaining global word lines, in response to the row decoding signal RDEC. During the erase operation of the flash memory device 200, the high voltage generator 205 supplies the erase voltage to the entire global word lines GWL1 to GWLJ. During the read operation or the normal read operation for program verification of the flash memory device 200, the high voltage generator 205 supplies the read pass voltage to the remaining global word lines GWL1 to GWLJ other than one.

The block selection unit 206 selects one or a part of the memory cell blocks MB1 to MBK in response to the row decoding signal RDEC and connects local word lines WL11 to WL1J (refer to FIG. 6) of a selected memory cell block (or memory cell blocks) to the global word lines GWL1 to GWLJ, respectively. Furthermore, the block selection unit 206 connects one of drain selection lines DSL1 to DSLK (refer to FIG. 6) of a selected memory cell block to a global drain selection line GDSL and connects one of source selection lines SSL1 to SSLK of a selected memory cell block (refer to FIG. 6) to a global source selection line GSSL.

The construction and operation of each of the page buffer 207, the Y-the decoder 209, the verify data comparator 208, and the data I/O buffer 210 is well known to those skilled in the art and description thereof will be omitted.

Figure 6:
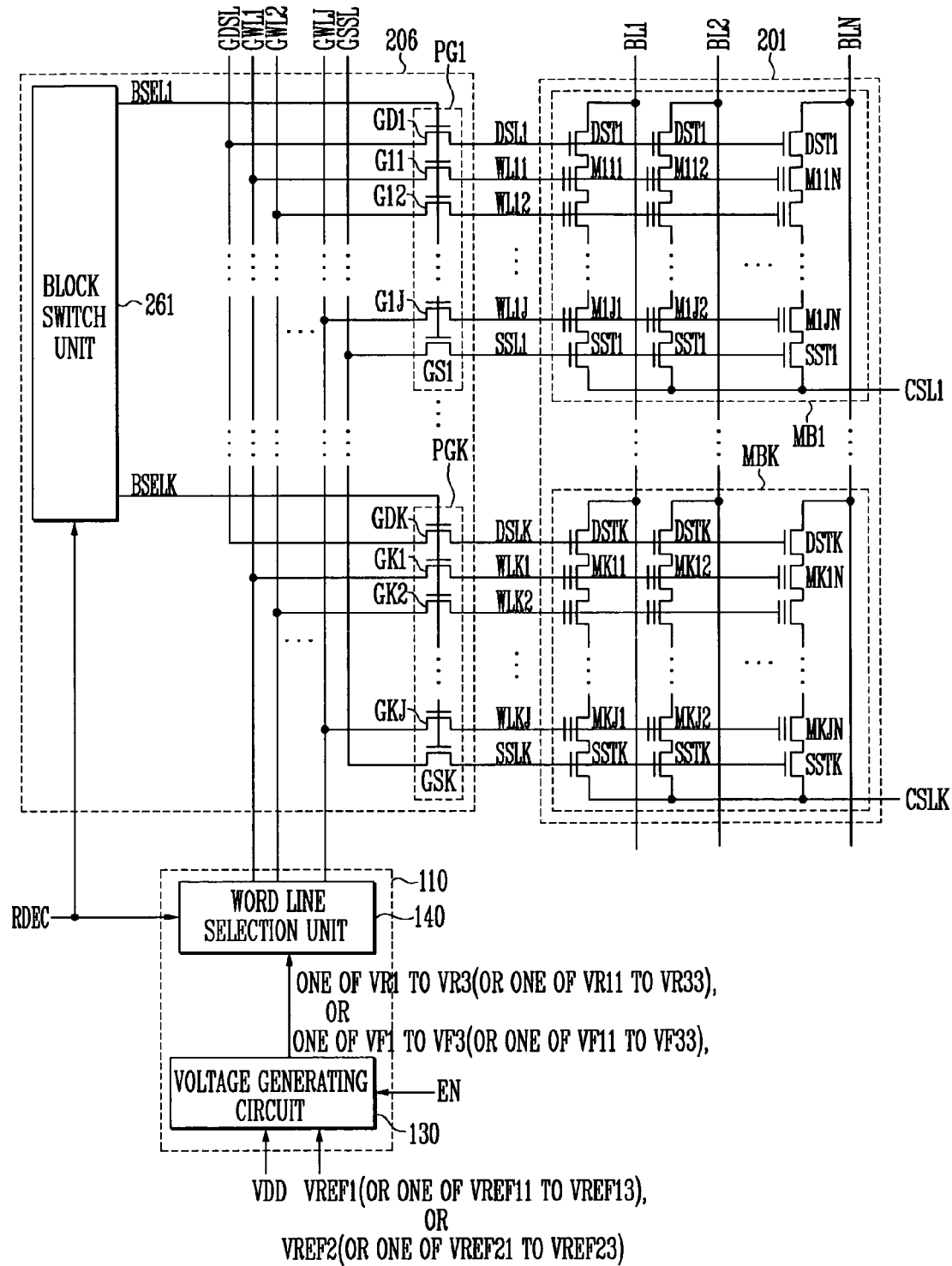
FIG. 6 is a detailed circuit diagram of a memory cell array, a block selection unit, a X-decoder, and a read voltage generator shown in FIG. 5 according to an embodiment of the present invention.

FIG. 6 is a detailed circuit diagram of the memory cell array, the block selection unit, the X-decoder, and the read voltage generator shown in FIG. 5.

Referring to FIG. 6, the memory cell block MB1 of the memory cell array 201 includes memory cells M111 to M1JN (J and N are integers), a drain select transistor DST1, and a source select transistor SST1.

The memory cells M111 to M1JN share bit lines BL1 to BLN (N is an integer), local word lines WL11 to WL1J (J is an integer), and the common source line CSL1. That is, the memory cells M111 to M11N are connected to the bit lines BL1 to BLN, respectively, through the drain select transistor DST1 and the memory cells M1J1 to M1JN are connected to the common source line CSL1 through the source select transistor SST1.

Furthermore, the memory cells M111 to M1JN have gates connected to the local word lines WL11 to WL1J, respectively. Meanwhile, the drain select transistors DST1 have gates connected to the local drain selection line DSL1 and the source select transistors SST1 have gates connected to the local source selection line SSL1. The construction of each of the memory cell blocks MB2 to MBK of the memory cell array 201 is the same as that of the memory cell block MB1 and description thereof will be omitted.

The block selection unit 206 includes a block switch unit 261 and pass gate circuits PG1 to PGK (K is an integer).

The block switch unit 261 outputs block selection signals BSEL1 to BSELK (K is an integer) in response to the row decoding signal RDEC. The pass gate circuits PG1 to PGK are disposed corresponding to the memory cell blocks MB1 to MBK one by one and are enabled or disabled in response to the block selection signals BSEL1 to BSELK, respectively.

Each of the pass gate circuits PG1 to PGK includes a plurality of pass gates. For example, the pass gate circuit PG1 may include pass gates GD1, G11 to G1J, and GS1. The construction and operation of each of the pass gate circuits PG2 to PGK are the same as those of the pass gate circuit PG1. Accordingly, only the operation of the pass gate circuit PG1 will be described as an example. Preferably, the pass gates GD1, G11 to G1J, and GS1 may be implemented using a NMOS transistors. Hereinafter, it is assumed that the pass gates GD1, G11 to G1J, and GS1 are the NMOS transistors.

The NMOS transistors GD1, G11 to G1J, and GS1 have gates to which the block selection signal BSEL1 is inputted. The NMOS transistor GD1 has a source connected to the global drain selection line GDSL and a drain connected to the local drain selection line DSL1. The NMOS transistors G11 to G1J have sources connected to the global word lines GWL1 to GWLJ, respectively, and drains connected to the local word lines WL11 to WL1J, respectively. The NMOS transistor GS1 has a source connected to the global source selection line GSSL and a drain connected to the local source selection line SSL1. The NMOS transistors GD1, G11 to G1J, and GS1 are turned on or off in response to the block selection signal BSEL1. In more detail, when the block selection signal BSEL1 is enabled, the NMOS transistors GD1, G11 to G1J, and GS1 are respectively turned on.

When the block selection signal BSEL1 is disabled, the NMOS transistors GD1, G11 to G1J, and GS1 are respectively turned off. When the NMOS transistors GD1, G11 to G1J, and GS1 are turned on, the global drain selection line GDSL is connected to the local drain selection line DSL1, the global source selection line GSSL is connected to the local source selection line SSL1, and the global word lines GWL1 to GWLJ are connected to the local word lines WL11 to WL1J, respectively.

The word line selection unit 140 of the read voltage generator 110 is connected to the global word lines GWL1 to GWLJ. The word line selection unit 140 supplies the read voltage (one of VR1 to VR3 (or one of VR11 to VR33)) or the verify voltage (one of VF1 to VF3 (or one of VF11 to VF33)) to any one of the global word lines GWL1 to GWLJ in response to the row decoding signal RDEC during the normal read operation or the read operation for program verification of the flash memory device 200.

The operation of the word line voltage generator 100 during the normal read operation or the read operation for program verification of the flash memory device 200 will be described in detail below. The process of allowing the word line voltage generator 100 to generate the word line voltage (i.e., the read voltage or the verify voltage) when the flash memory device 200 includes the SLC will be described below with reference to FIGS. 7A to 7C.

Figure 7A:
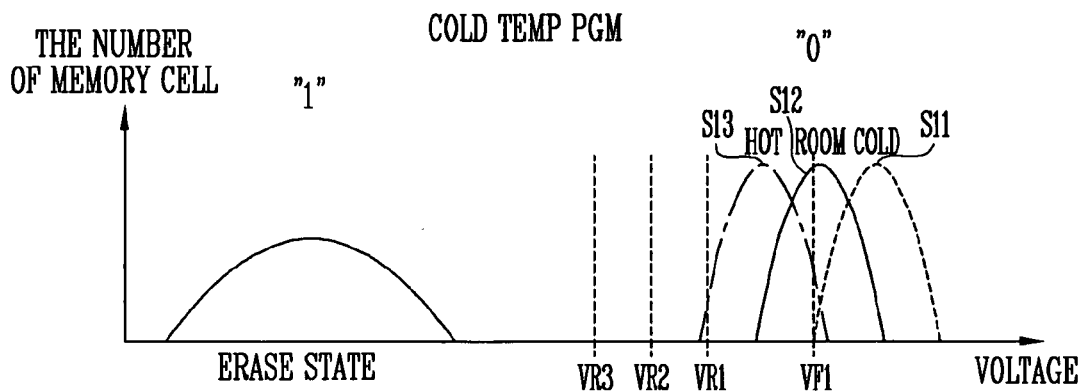
FIGS. 7A to 7C are graphs illustrating the threshold voltage distributions of SLCs according to the program procedure when the flash memory device shown in FIG. 5 includes the SLCs according to an embodiment of the present invention.
Figure 7B:
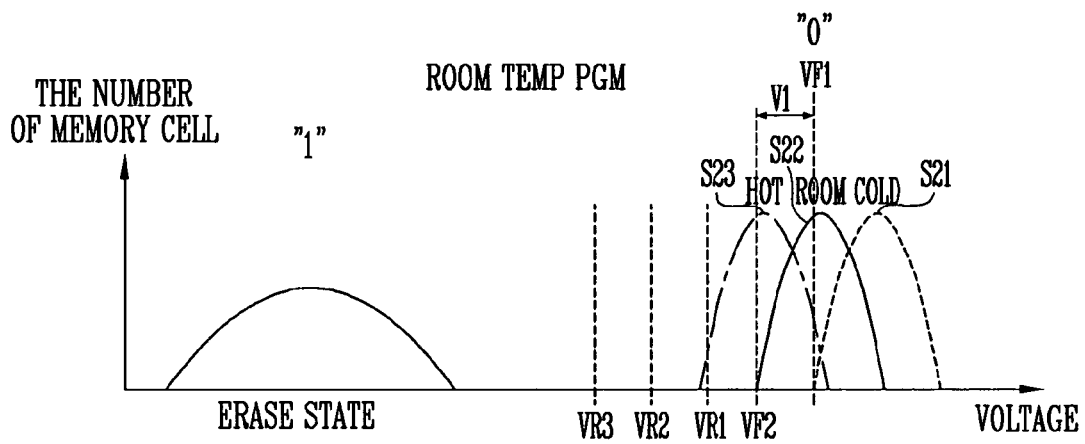
Figure 7C:
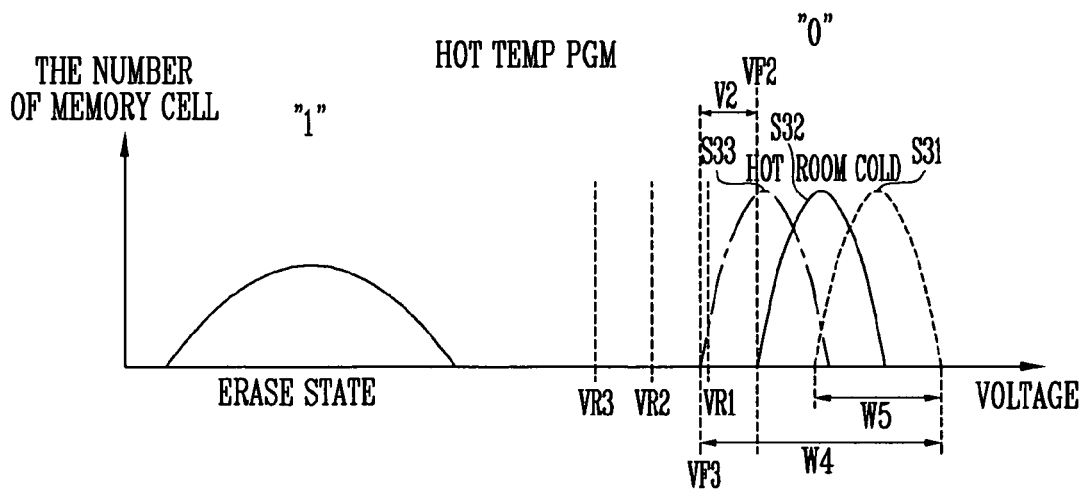

In FIG. 7A, graphs S11 to S13 illustrate the threshold voltage distributions of SLCs, respectively, when the data of the SLCs programmed at the cold temperature are read at the cold temperature, room temperature (for example, 25° C.), and hot temperature (for example, 90° C.), respectively. In FIG. 7B, graphs S21 to S23 illustrate the threshold voltage distributions of SLCs, respectively, when the data of the SLCs programmed at room temperature are read at the cold temperature, room temperature, and the hot temperature, respectively. In FIG. 7C, graphs S31 to S33 illustrate the threshold voltage distributions of SLCs, respectively, when the data of the SLCs programmed at the hot temperature are read at the cold temperature, room temperature, and the hot temperature, respectively.

In the present embodiment, an example in which data stored in the memory cells M111 to M11N of the memory cell block MB1 are read (read for program verification or normal read) will be described.

The operation of the word line voltage generator 100 during the read operation for program verification, of the flash memory device 200, will be first described below.

An Incremental Step Pulse Programming (ISPP) method of programming a selected page several times, while gradually increasing a program voltage on a set-step-voltage basis, may be applied to the program method of the flash memory device 200.

The control logic circuit 203 generates the program command PGM in response to the external control signals /WE, /RE, ALE, and CLE and the command signal CMD and generates the row address signal ROWADD based on the external address signal ADD. The control logic circuit 203 also generates the enable control signal EN and the verify control signal VRCTL in response to the program command PGM.

The X-decoder 204 decodes the row address signal ROWADD and outputs the row decoding signal RDEC.

The high voltage generator 205 generates the drain bias voltage VGD and the source bias voltage VGS in response to the program command PGM and the row decoding signal RDEC and supplies them to the global drain selection line GDSL and the global source selection line GSSL, respectively. Furthermore, the high voltage generator 205 generates the read pass voltage as the word line voltage VW in response to the program command PGM and supplies it to the remaining global word lines GWL2 to GWLJ, respectively, except for the global word line GWL1 in response to the row decoding signal RDEC.

Meanwhile, the controller 120 of the word line voltage generator 100 is enabled in response to the enable control signal EN. The controller 120 generates the reference voltage VREF2 in response to the verify control signal VRCTL.

The read voltage generator 110 of the word line voltage generator 100 generates the verify voltage (one of VF1 to VF3) based on the reference voltage VREF2 and the internal voltage VDD. Furthermore, the read voltage generator 110 supplies the verify voltage (one of VF1 to VF3) to the global word line GWL1 in response to the row decoding signal RDEC. At this time, the read voltage generator 110 generates the verify voltage (one of VF1 to VF3), which is changed in reverse proportion to a temperature.

For example, when the read operation for program verification is performed at the cold temperature, the read voltage generator 110 may generate an increased verify voltage VF1.

Furthermore, at room temperature, the read voltage generator 110 may generate a verify voltage VF2, which is V1 lower than the verify voltage VF1. At the hot temperature, the read voltage generator 110 may generate a verify voltage VF3, which is V2 lower than the verify voltage VF2.

The block selection unit 206 connects the global drain selection line GDSL to the local drain selection line DSL1, the global source selection line GSSL to the local source selection line SSL1, and the global word lines GWL1 to GWLJ to the local word lines WL11 to WL1J, respectively, in response to the row decoding signal RDEC. As a result, one of the verify voltages VF1 to VF3 is inputted to the gates of the memory cells M111 to M11N through the global word line GLW1 and the local word line WL11.

As described above, the read voltage generator 110 generates one of the verify voltages VF1 to VF3 that are varied in reverse proportion to a temperature. Therefore, the width of the threshold voltage distributions of the memory cells M111 to M11N that are programmed can be reduced. This will be described in more detail below.

Although the verify voltage transferred to the gates of the memory cells M111 to M11N is lowered as the operating conditions of the internal circuits of the flash memory device 200 are varied at the cold temperature, the read voltage generator 110 can supply the verify voltage VF1 that is sufficiently increased to the global word line GWL1. Accordingly, the program operation of the memory cells M111 to M11N can be performed sufficiently.

Furthermore, although the verify voltage transferred to the gates of the memory cells M111 to M11N is increased as the operating conditions of the internal circuits of the flash memory device 200 are varied at the hot temperature, the read voltage generator 110 can supply the verify voltage VF1 that is sufficiently lowered to the global word line GWL1. Accordingly, the program operation of the memory cells M111 to M11N can be prevented from being performed excessively.

Figure 1A:
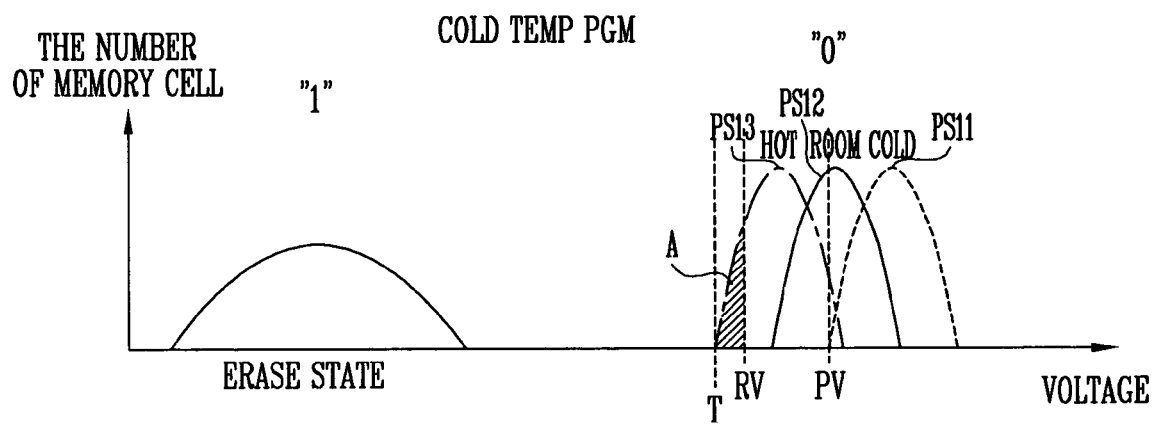
FIGS. 1A to 1C are graphs illustrating the threshold voltage distributions of memory cells according to the program procedure of the flash memory device in the related art.
Figure 1B:
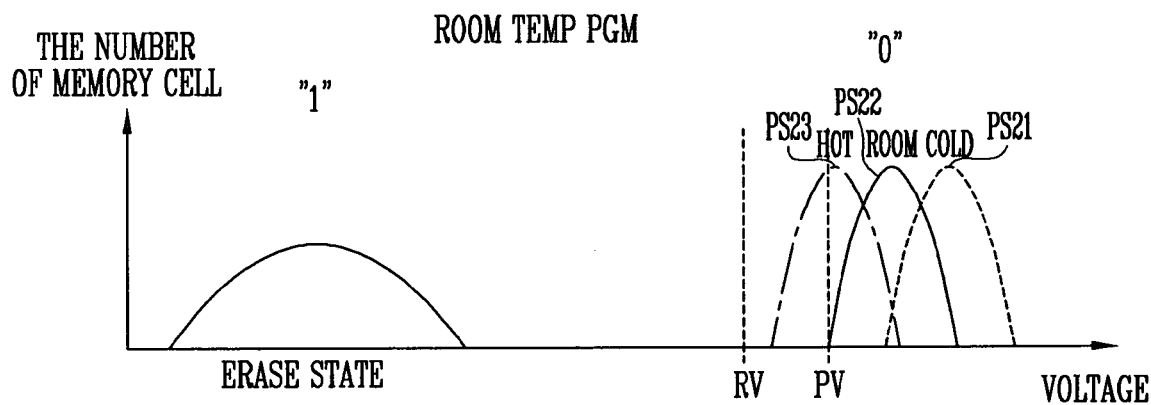
Figure 1C:
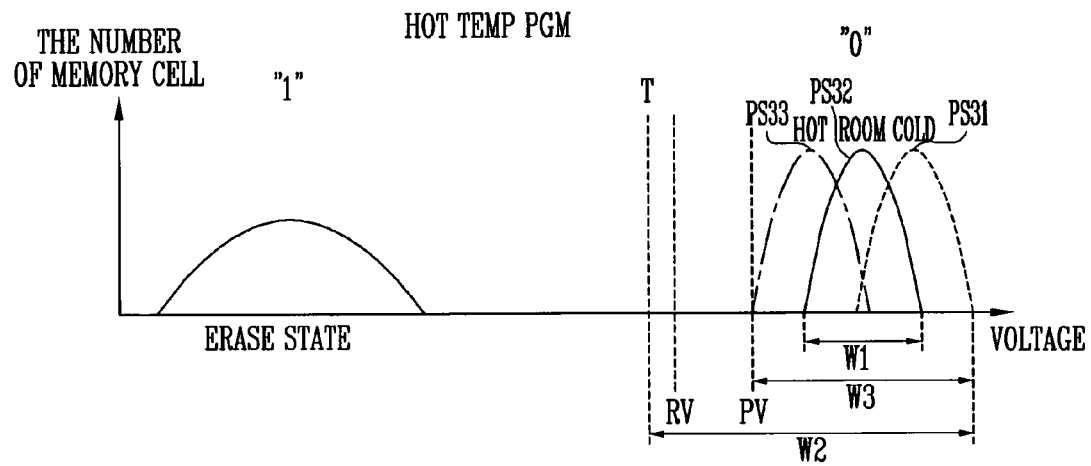

As described above, as the word line voltage generator 100 generates the verify voltage in reverse proportion to a temperature, the threshold voltage of a programmed SLC is not influenced by a temperature during the program operation. Accordingly, the width of the threshold voltage distributions of the programmed SLC can have a width smaller than "W1" shown in FIGS. 1A to 1C, as indicated by "W4".

The operation of the word line voltage generator 100 during the normal read operation of the flash memory device 200 will be described below.

The control logic circuit 203 generates the read command READ in response to the external control signals /WE, /RE, ALE, and CLE and the command signal CMD and generates the row address signal ROWADD based on the external address signal ADD. The control logic circuit 203 also generates the enable control signal EN and the read control signal RCTL in response to the read command READ.

The X-decoder 204 decodes the row address signal ROWADD and outputs the row decoding signal RDEC.

The high voltage generator 205 generates the drain bias voltage VGD and the source bias voltage VGS in response to the read command READ and the row decoding signal RDEC and supplies them to the global drain selection line GDSL and the global source selection line GSSL, respectively. The high voltage generator 205 also generates the read pass voltage as the word line voltage VW in response to the read command READ and supplies it to the remaining global word lines GWL2 to GWLJ, respectively, except for the global word line GWL1 in response to the row decoding signal RDEC.

Meanwhile, the controller 120 of the word line voltage generator 100 is enabled in response to the enable control signal EN. The controller 120 generates the reference voltage VREF1 in response to the read control signal RCTL.

The read voltage generator 110 generates one of the read voltage VR1 to VR3 based on the reference voltage VREF1 and the internal voltage VDD. Furthermore, the read voltage generator 110 supplies the read voltage (one of VR1 to VR3) to the global word line GWL1 in response to the row decoding signal RDEC. At this time, the read voltage generator 110 generates the read voltage (one of VR1 to VR3), which is changed in reverse proportion to a temperature.

For example, when the normal read operation is performed at the cold temperature, the read voltage generator 110 may generate an increased read voltage VR1. Furthermore, at room temperature, the read voltage generator 110 may generate the read voltage VR2 lower than the read voltage VR1. At the hot temperature, the read voltage generator 110 may generate the read voltage VR3 lower than the read voltage VR2.

The block selection unit 206 connects the global drain selection line GDSL to the local drain selection line DSL1, the global source selection line GSSL to the local source selection line SSL1, and the global word lines GWL1 to GWLJ to the local word lines WL11 to WL1J, respectively, in response to the row decoding signal RDEC. Consequently, the read voltage (one of VR1 to VR3) is inputted to the gates of the memory cells M111 to M11N through the global word line GLW1 and the local word line WL11.

As described above, the read voltage generator 110 generates the read voltage (one of VR1 to VR3), which is changed in reverse proportion to a temperature. Accordingly, during the read operation, the width of the threshold voltage distributions of the memory cells M111 to M11N can be reduced as indicated by "W5". This will be described in more detail below.

Although the read voltage transferred to the gates of the memory cells M111 to M11N is lowered as the operating conditions of the internal circuits of the flash memory device 200 are varied at cold temperature, the read voltage generator 110 can supply the verify voltage VF1, which is sufficiently increased, to the global word line GWL1. Furthermore, although the read voltage transferred to the gates of the memory cells M111 to M11N is increased at hot temperature, the read voltage generator 110 can supply the verify voltage VF3, which is sufficiently decreased, to the global word line GWL1.

As described above, when the threshold voltage distributions of the memory cells M111 to M11N are varied depending on a temperature, the level of the read voltage is changed accordingly. Therefore, the width of the threshold voltage distributions of the memory cells M111 to M11N during the read operation can be reduced as indicated by "W5".

As a result, as shown in FIGS. 7A to 7C, the voltage difference between the lowest voltage of threshold voltages of a SLC, which are indicated by graphs S11, S21, and S31, and the read voltage VR1, the voltage difference between the lowest voltage of threshold voltages of a SLC, which are indicated by graphs S12, S22, and S32, and the read voltage VR2, and the voltage difference between the lowest voltage of threshold voltages of a SLC, which are indicated by graphs S31, S32, and S33, and the read voltage VR3 can be maintained to the same.

Accordingly, during the normal read operation of the flash memory device 200, failure in the read operation can be reduced and the sensing margin of read data can be guaranteed stably.

The process of allowing the word line voltage generator 100 to generate a word line voltage (i.e., the read voltage or the verify voltage) when the flash memory device 200 includes a MLC will be described below with reference to FIGS. 8A to 8C.

In FIG. 8a, graphs C11 to C13, C21 to C23, and C31 to C33 illustrate the threshold voltage distributions of MLCs, respectively, when the data of the MLCs programmed at the cold temperature are read at the cold temperature, room temperature (for example, 25° C.), and the hot temperature (for example, 90° C.), respectively.

In FIG. 8B, graphs R11 to R13, R21 to R23, and R31 to R33 illustrate the threshold voltage distributions of MLCs, respectively, when the data of the MLCs programmed at room temperature are read at the cold temperature, room temperature, and the hot temperature, respectively.

Figure 8C:
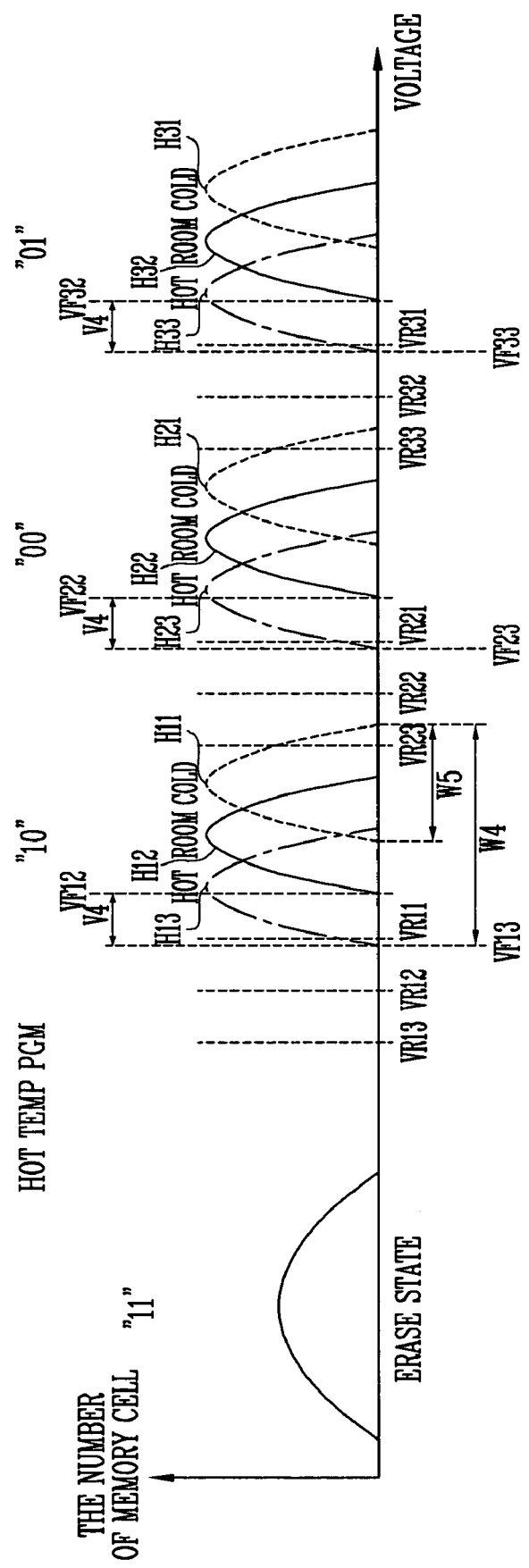

In FIG. 8C, graphs H11 to H13, H21 to H23, and H31 to H33 illustrate the threshold voltage distributions of MLCs, respectively, when the data of the MLCs programmed at the hot temperature are read at the cold temperature, room temperature, and the hot temperature, respectively.

In the present embodiment, an example in which data stored in the memory cells M111 to M11N of the memory cell block MB1 are read (read for program verification or normal read) will be described.

The operation of the word line voltage generator 100 during the read operation for program verification, of the flash memory device 200, will be first described below. The read operation for program verification, of the flash memory device 200, is the same as the above-mentioned verify read operation of the SLC except for several differences. Accordingly, only the differences will be described for simplicity.

The control logic circuit 203 generates the enable control signal EN and the verify signal VRCTL1 in response to the program command PGM. The controller 120 generates the reference voltage VREF21 in response to the verify signal VRCTL1.

The read voltage generator 110 generates the verify voltage (one of VF11 to VF13) based on the reference voltage VREF21 and the internal voltage VDD. Furthermore, the read voltage generator 110 supplies the verify voltage (one of VF11 to VF13) to the global word line GWL1 in response to the row decoding signal RDEC. At this time, the read voltage generator 110 generates the verify voltage (one of VF11 to VF13), which is changed in reverse proportion to a temperature.

For example, when the verify read operation is performed at the cold temperature, the read voltage generator 110 may generated an increased verify voltage VF11. Furthermore, at room temperature, the read voltage generator 110 may generate the verify voltage VF12, which is V3 lower than the verify voltage VF11. At the hot temperature, the read voltage generator 110 may generate the verify voltage VF13, which is V4 lower than the verify voltage VF12.

Meanwhile, the control logic circuit 203 determines whether data "10" have been programmed into a part or all of the memory cells M111 to M11N based on compare signals CM1 to CMN (N is an integer) received from the verify data comparator 208. The compare signals CM1 to CMN are the results of comparing verify data, which are read from the memory cells M111 to M11N, with reference data when one of the verify voltage VF11 to VF13 is inputted to the gates of the memory cells M111 to M11N. A detailed operation of the verify data comparator 208 will be evident to those skilled in the art and description thereof will be omitted.

If it is determined that the data "10" have been programmed into a part or all of the memory cells M111 to M11N, the control logic circuit 203 generates the verify signal VRCTL2. The controller 120 generates the reference voltage VREF22 in response to the verify signal VRCTL2. The read voltage generator 110 generates the verify voltage (one of VF21 to VF23) based on the reference voltage VREF22 and the internal voltage VDD.

Furthermore, the read voltage generator 110 supplies the verify voltage (one of VF21 to VF23) to the global word line GWL1 in response to the row decoding signal RDEC. At this time, the read voltage generator 110 generates the verify voltage (one of VF21 to VF23), which is changed in reverse proportion to a temperature.

For example, when the verify read operation is performed at cold temperature, the read voltage generator 110 may generate an increased verify voltage VF21. Furthermore, at room temperature, the read voltage generator 110 may generate the verify voltage VF22, which is V3 lower than the verify voltage VF21. At the hot temperature, the read voltage generator 110 may generate the verify voltage VF23, which is V4 lower than the verify voltage VF22.

The control logic circuit 203 then determines whether data "00" have been programmed into a part or all of the memory cells M111 to M11N based on the compare signals CM1 to CMN. If it is determined that the data "00" have been programmed into a part or all of the memory cells M111 to M11N, it generates the verify signal VRCTL3.

The controller 120 generates the reference voltage VREF23 in response to the verify signal VRCTL3

The read voltage generator 110 generates the verify voltage (one of VF31 to VF33) based on the reference voltage VREF23 and the internal voltage VDD. The read voltage generator 110 supplies the verify voltage (one of VF31 to VF33) to the global word line GWL1 in response to the row decoding signal RDEC. At this time, the read voltage generator 110 generates the verify voltage (one of VF31 to VF33), which is changed in reverse proportion to a temperature.

For example, when the verify read operation is performed at the cold temperature, the read voltage generator 110 may generate an increased verify voltage VF31. Furthermore, at room temperature, the read voltage generator 110 may generate the verify voltage VF32, which is V3 lower than the verify voltage VF31. At the hot temperature, the read voltage generator 110 may generate the verify voltage VF33, which is V4 lower than the verify voltage VF32.

The operation of the word line voltage generator 100 during the normal read operation of the flash memory device 200 will be described below. The normal read operation of the flash memory device 200 is the same as the above-mentioned normal read operation of the SLC except for several differences. Accordingly, only the differences will be described for simplicity.

The control logic circuit 203 generates the enable control signal EN and a read signal (one of RCTL1 to RCTL3) in response to the read command READ. The controller 120 generates the reference voltage (one of VREF11 to VREF13) in response to the read signal (one of RCTL1 to RCTL3). The read voltage generator 110 generates the read voltage (one of VR11 to VR13, one of VR21 to VR23 or one of VR31 to VR33) based on the reference voltage (one of VREF11 to VREF13) and the internal voltage VDD.

As described above, the word line voltage generator 100 generates the verify voltage or the read voltage in reverse proportion to a temperature. Accordingly, the threshold voltage of a programmed MLC is not influenced by a temperature during the program operation. This can reduce the width of threshold voltage distributions of the programmed MLC. Consequently, the program operating speed of the flash memory device 200 can be enhanced and the occurrence of the program disturbance phenomenon can be reduced.

As described above, in accordance with the word line voltage generator and the flash memory device including the same, and method of generating the word line voltage thereof according to the present invention, during the read operation for program verification or normal read operation, the verify voltage or the read voltage is selectively changed in reverse proportion to a temperature. Accordingly, the present invention is advantageous in that it can reduce the width of threshold voltage distributions of a memory cell and can guarantee the sensing margin of read data stably.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A word line voltage generator of a flash memory device including a plurality of memory cells, the word line voltage generator comprising:
   a read voltage generator that generates a read voltage or a verify voltage based on one of reference voltages in response to an enable control signal and supplies the read voltage or the verify voltage to one of a plurality of global word lines in response to a row decoding signal, during a read operation or a read operation for program verification, of the flash memory device; and
   a controller that generates one of the reference voltages in response to a read control signal or a verify control signal,
   wherein when a temperature is varied, the read voltage generator changes the level of the read voltage or the verify voltage in reverse proportion to the temperature.

2. The word line voltage generator as claimed in claim 1, wherein the plurality of memory cells include single-level cells.

3. The word line voltage generator as claimed in claim 2, wherein the reference voltages include a first reference voltage and a second reference voltage, and
   the controller generates the first reference voltage in response to the read control signal and generates the second reference voltage in response to the verify control signal.

4. The word line voltage generator as claimed in claim 3, wherein the read voltage generator comprises:
   a voltage generating circuit enabled or disabled in response to the enable control signal; and
   a word line selection unit that selects one of the plurality of global word lines in response to the row decoding signal and supplies a selected global word line with the read voltage or the verify voltage,
   wherein the voltage generating circuit generates the read voltage, which is changed in reverse proportion to a temperature, based on the first reference voltage and the internal voltage when the first reference voltage is received, and generates the verify voltage, which is changed in reverse proportion to a temperature, based on the second reference voltage and the internal voltage when the second reference voltage is received.

5. The word line voltage generator as claimed in claim 4, wherein the voltage generating circuit comprises:
   a voltage divider that divides the internal voltage according to a resistance ratio changed depending on a temperature in response to the enable control signal and outputs divided voltages to a control node; and an operational amplifier circuit that outputs the read voltage or the verify voltage based on the first or second reference voltage and the divided voltages.

6. The word line voltage generator as claimed in claim 5, wherein the voltage divider comprises:
   a switching circuit that is connected between the internal voltage and the control node and is turned on or off in response to the enable control signal; and
   a resistor connected between the control node and a ground voltage,
   wherein a resistance value of the switching circuit is changed according to a temperature, and when the resistance value of the switching circuit is changed, the divided voltages are changed.

7. The word line voltage generator as claimed in claim 5, wherein the operational amplifier circuit comprises:
   a first resistor having one terminal connected to the control node;
   an operational amplifier having a first input terminal connected to the other terminal of the first resistor and a second input terminal to which the first or second reference voltage is inputted; and
   a second resistor connected between an output terminal of the operational amplifier and the first input terminal, for forming a feedback loop of the operational amplifier,
   wherein the operational amplifier has a gain decided according to a resistance ratio of the first and second resistors, and outputs the read voltage or the verify voltage based on the divided voltages and the first or second reference voltage.

8. The word line voltage generator as claimed in claim 1, wherein the plurality of memory cells include multi-level cells.

9. The word line voltage generator as claimed in claim 8, wherein the read control signal includes first to third read signals, the verify control signal includes first to third verify signals, and the reference voltages include first to sixth reference voltages; and
   the controller generates one of the first to third reference voltages in response to one of the first to third read signals and generates one of the fourth to sixth reference voltages in response to one of the first to third verify signals.

10. The word line voltage generator as claimed in claim 9, wherein the read voltage includes first to third read bias voltages, and the verify voltage includes first to third verify bias voltages; and
   the read voltage generator comprises:
   a voltage generating circuit that is enabled or disabled in response to the enable control signal; and
   a word line selection unit that selects one of the plurality of global word lines in response to the row decoding signal and supplies a selected global word line with one of the first to third read bias voltages or one of the first to third verify bias voltages,
   wherein the voltage generating circuit generates one of the first to third read bias voltages, which are respectively changed in reverse proportion to a temperature, based on one of the first to third reference voltages and the internal voltage when one of the first to third reference voltages is received, and generates one of the first to third verify bias voltages, which are respectively changed in reverse proportion to a temperature, based on one of the fourth to sixth reference voltages and the internal voltage when one of the fourth to sixth reference voltages is received.

11. The word line voltage generator as claimed in claim 10, wherein the voltage generating circuit comprises:
   a voltage divider that divides the internal voltage according to a resistance ratio, which is changed depending on a temperature, in response to the enable control signal and outputs divided voltages to the control node; and
   an operational amplifier circuit that outputs one of the first to third read bias voltages or one of the first to third verify bias voltages based on one of the first to sixth reference voltages and the divided voltages.

12. The word line voltage generator as claimed in claim 11, wherein the voltage divider comprises:
   a switching circuit that is connected between the internal voltage and the control node and is turned on or off in response to the enable control signal; and
   a resistor connected between the control node and a ground voltage,
   wherein a resistance value of the switching circuit is changed according to a temperature, and when the resistance value of the switching circuit is changed, the divided voltages are changed.

13. The word line voltage generator as claimed in claim 11, wherein the operational amplifier circuit comprises:
   a first resistor having one terminal connected to the control node;
   an operational amplifier having a first input terminal connected to the other terminal of the first resistor and a second input terminal to which one of the first to sixth reference voltages is inputted; and
   a second resistor connected between an output terminal of the operational amplifier and the first input terminal, for forming a feedback loop of the operational amplifier,
   wherein the operational amplifier has a gain decided according to a resistance ratio of the first and second resistors, and outputs one of the first to third read bias voltages or one of the first to third verify bias voltages based on one of the first to sixth reference voltages and the divided voltages.

14. A flash memory device, comprising:
   a memory cell array including a plurality of memory cell blocks respectively having a plurality of memory cells;
   a X-decoder that decodes a row address signal and generates a row decoding signal;
   a high voltage generator that generates a drain bias voltage, a source bias voltage, and a word line voltage and supplies the drain bias voltage and the source bias voltage to a global drain selection line and a global source selection line, respectively, in response to a read command, a program command, and an erase command, and supplies the word line voltage to a part or all of a plurality of global word lines in response to the row decoding signal;
   a block selection unit that selects one of the plurality of memory cell blocks in response to the row decoding signal, and connects a local drain selection line, a local source selection line, and a plurality of local word lines of a selected memory cell block to the global drain selection line, the global source selection line, and the plurality of global word lines, respectively; and
   a word line voltage generator that generates a read voltage or a verify voltage, which is changed in reverse proportion to a temperature, in response to an enable control signal and a read control signal or a verify control signal, and supplies the read voltage or the verify voltage to one of the plurality of global word lines in response to the row decoding signal, during a read operation or a read operation for program verification, of the flash memory device.

15. The flash memory device as claimed in claim 14, further comprising a control logic circuit that receives a command signal or a external address signal in response to external control signals, generates one of the read command, the program command, and the erase command in response to the command signal, and generates the row address signal and a column address signal based on the external address signal,
wherein the control logic circuit further generates the enable control signal and the read control signal or the verify control signal in response to the read command or the program command.

16. The flash memory device as claimed in claim 14, wherein the word line voltage generator comprises:
a read voltage generator that generates the read voltage or the verify voltage based on one of reference voltages in response to the enable control signal, and supplies the read voltage or the verify voltage to one of the plurality of global word lines in response to the row decoding signal; and
a controller that generates one of the reference voltages in response to the read control signal or the verify control signal,
wherein when a temperature is changed, the read voltage generator changes the level of the read voltage or the verify voltage in reverse proportion to the temperature.

17. The flash memory device as claimed in claim 16, wherein the plurality of memory cells include single-level cells.

18. The flash memory device as claimed in claim 17, wherein the reference voltages include a first reference voltage and a second reference voltage, and
the controller generates the first reference voltage in response to the read control signal and generates the second reference voltage in response to the verify control signal.

19. The flash memory device as claimed in claim 18, wherein the read voltage generator comprises:
a voltage generating circuit enabled or disabled in response to the enable control signal; and
a word line selection unit that selects one of the plurality of global word lines in response to the row decoding signal and supplies a selected global word line with the read voltage or the verify voltage,
wherein the voltage generating circuit generates the read voltage, which is changed in reverse proportion to a temperature, based on the first reference voltage and the internal voltage when the first reference voltage is received, and generates the verify voltage, which is changed in reverse proportion to a temperature, based on the second reference voltage and the internal voltage when the second reference voltage is received.

20. The flash memory device as claimed in claim 19, wherein the voltage generating circuit comprises:
a voltage divider that divides the internal voltage according to a resistance ratio changed depending on a temperature in response to the enable control signal and outputs divided voltages to a control node; and
an operational amplifier circuit that outputs the read voltage or the verify voltage based on the first or second reference voltage and the divided voltages.

21. The flash memory device as claimed in claim 20, wherein the voltage divider comprises:
a switching circuit that is connected between the internal voltage and the control node and is turned on or off in response to the enable control signal; and
a resistor connected between the control node and a ground voltage,
wherein a resistance value of the switching circuit is changed according to a temperature, and when the resistance value of the switching circuit is changed, the divided voltages are changed.

22. The flash memory device as claimed in claim 20, wherein the operational amplifier circuit comprises:
a first resistor having one terminal connected to the control node;
an operational amplifier having a first input terminal connected to the other terminal of the first resistor and a second input terminal to which the first or second reference voltage is inputted; and
a second resistor connected between an output terminal of the operational amplifier and the first input terminal, for forming a feedback loop of the operational amplifier,
wherein the operational amplifier has a gain decided according to a resistance ratio of the first and second resistors, and outputs the read voltage or the verify voltage based on the divided voltages and the first or second reference voltage.

23. The flash memory device as claimed in claim 16, wherein the plurality of memory cells include multi-level cells.

24. The flash memory device as claimed in claim 23, wherein the read control signal includes first to third read signals, the verify control signal includes first to third verify signals, and the reference voltages include first to sixth reference voltages; and
the controller generates one of the first to third reference voltages in response to one of the first to third read signals and generates one of the fourth to sixth reference voltages in response to one of the first to third verify signals.

25. The flash memory device as claimed in claim 24, wherein the read voltage includes first to third read bias voltages, and the verify voltage includes first to third verify bias voltages; and
the read voltage generator comprises:
a voltage generating circuit that is enabled or disabled in response to the enable control signal; and
a word line selection unit that selects one of the plurality of global word lines in response to the row decoding signal and supplies a selected global word line with one of the first to third read bias voltages or one of the first to third verify bias voltages,
wherein the voltage generating circuit generates one of the first to third read bias voltages, which are respectively changed in reverse proportion to a temperature, based on one of the first to third reference voltages and the internal voltage when one of the first to third reference voltages is received, and generates one of the first to third verify bias voltages, which are respectively changed in reverse proportion to a temperature, based on one of the fourth to sixth reference voltages and the internal voltage when one of the fourth to sixth reference voltages is received.

26. The flash memory device as claimed in claim 25, wherein the voltage generating circuit comprises:
a voltage divider that divides the internal voltage according to a resistance ratio, which is changed depending on a temperature, in response to the enable control signal and outputs divided voltages to the control node; and
an operational amplifier circuit that outputs one of the first to third read bias voltages or one of the first to third verify bias voltages based on one of the first to sixth reference voltages and the divided voltages.

27. The flash memory device as claimed in claim 26, wherein the voltage divider comprises:

a switching circuit that is connected between the internal voltage and the control node and is turned on or off in response to the enable control signal; and a resistor connected between the control node and a ground voltage, wherein a resistance value of the switching circuit is changed according to a temperature, and when the resistance value of the switching circuit is changed, the divided voltages are changed.

28. The flash memory device as claimed in claim 26, wherein the operational amplifier circuit comprises:

a first resistor having one terminal connected to the control node;

an operational amplifier having a first input terminal connected to the other terminal of the first resistor and a second input terminal to which one of the first to sixth reference voltages is inputted; and a second resistor connected between an output terminal of the operational amplifier and the first input terminal, for forming a feedback loop of the operational amplifier, wherein the operational amplifier has a gain decided according to a resistance ratio of the first and second resistors, and outputs one of the first to third read bias voltages or one of the first to third verify bias voltages based on one of the first to sixth reference voltages and the divided voltages.

29. A method of generating a word line voltage during a read operation or a read operation for program verification, of a flash memory device including a plurality of memory cells, the method comprising the steps of:

generating one of reference voltages in response to, a read control signal or a verify control signal;

generating a read voltage or a verify voltage, which is changed in reverse proportion to a temperature and is based on one of the reference voltages, as the word line voltage in response to an enable control signal; and supplying the read voltage or the verify voltage to one of a plurality of global word lines in response to a row decoding signal.

30. The method as set forth in claim 29, further comprising the steps of:

generating the enable control signal and a read control signal or a verify control signal based on a read command or a program command;

decoding a row address signal and generating the row decoding signal;

generating a drain bias voltage, a source bias voltage, and a word line bias voltage in response to the read command or the program command;

supplying the drain bias voltage and the source bias voltage to a global drain selection line and a global source selection line, respectively;

supplying the word line bias voltage to each of the remaining global word lines in response to the row decoding signal; and connecting a local drain selection line, a local source selection line, and local word lines to which the plurality of memory cells are connected to the global drain selection line, the global source selection line, and the global word lines, respectively, in response to the row decoding signal.

31. The method as set forth in claim 29, wherein the plurality of memory cells comprise single-level cells.

32. The method as set forth in claim 29, wherein the plurality of memory cells comprise multi-level cells.

\* \* \* \* \*